US008170165B2

(12) United States Patent
Arviv et al.

(10) Patent No.: US 8,170,165 B2
(45) Date of Patent: May 1, 2012

(54) CLOCK CALIBRATION IN SLEEP MODE

(75) Inventors: Binyamin Arviv, Tzur Moshe (IL); Doron Kalil, Kadima (IL); Efraim Orian, Pardessia (IL); Eyal Yair, Givat-Ela (IL)

(73) Assignee: Agere Systems Inc., Allentown, PA (US)

( * ) Notice: Subject to any disclaimer, the term of this patent is extended or adjusted under 35 U.S.C. 154(b) by 754 days.

(21) Appl. No.: 12/269,126

(22) Filed: Nov. 12, 2008

(65) Prior Publication Data

US 2009/0147899 A1 Jun. 11, 2009

Related U.S. Application Data

(60) Provisional application No. 60/992,467, filed on Dec. 5, 2007.

(51) Int. Cl.
*H04L 7/00* (2006.01)

(52) U.S. Cl. .......................................... 375/354; 375/359

(58) Field of Classification Search ................... 375/359, 375/354; 368/118, 156, 10, 155; 331/74, 331/1, 18, 44, 16; 340/10.1, 572.1, 539.22; 702/89, 106; 455/343, 38.3, 573, 265
See application file for complete search history.

(56) References Cited

U.S. PATENT DOCUMENTS

| | | | | | |
|---|---|---|---|---|---|
| 5,845,204 A | * | 12/1998 | Chapman et al. | .......... | 455/343.1 |
| 6,029,061 A | * | 2/2000 | Kohlschmidt | ................ | 455/574 |
| 6,219,564 B1 | * | 4/2001 | Grayson et al. | ................ | 455/574 |
| 6,885,254 B2 | * | 4/2005 | Kranz | ............................ | 331/74 |
| 6,961,287 B2 | * | 11/2005 | Jung | ............................. | 368/155 |
| 7,272,078 B1 | * | 9/2007 | Haartsen | ........................ | 368/118 |
| 7,529,531 B2 | * | 5/2009 | Wang et al. | ................... | 455/265 |
| 2002/0038190 A1 | * | 3/2002 | Ballantyne | .................... | 702/106 |
| 2003/0095008 A1 | * | 5/2003 | Kranz | ............................. | 331/18 |
| 2005/0221870 A1 | * | 10/2005 | Erdelyi et al. | ................ | 455/574 |
| 2005/0241362 A1 | * | 11/2005 | Oberle et al. | .................. | 73/1.42 |
| 2005/0254610 A1 | * | 11/2005 | Liu et al. | ........................ | 375/354 |
| 2007/0190964 A1 | * | 8/2007 | Edwards et al. | ........... | 455/343.1 |
| 2007/0213028 A1 | * | 9/2007 | Shohara et al. | ............ | 455/343.1 |
| 2008/0001744 A1 | * | 1/2008 | Batra et al. | ................. | 340/572.1 |
| 2008/0278244 A1 | * | 11/2008 | Wang et al. | ...................... | 331/16 |

\* cited by examiner

*Primary Examiner* — Kabir A Timory
*Assistant Examiner* — Helene Tayong
(74) *Attorney, Agent, or Firm* — Mendelsohn, Drucker & Associates, P.C.; Craig M. Brown; Steve Mendelsohn

(57) ABSTRACT

In one embodiment, an improvement is described for synchronization between devices in, e.g., a wireless network, wherein at least one device includes both a slow clock and a fast clock for different modes of operation. The fast clock for an active mode of operation is calibrated after a sleep mode of operation during which the slow clock is employed for device timing. Calibration employs a filter-based technique. Counts for the slow clock and for the fast clock are measured over a first interval, and the number of slow-clock counts is measured over a second interval. An estimate for the number of fast counts over the second interval is generated, filtered to reduce noise and error effects, and then employed to update the fast clock in the active mode of operation.

18 Claims, 2 Drawing Sheets

US 8,170,165 B2

CLOCK CALIBRATION IN SLEEP MODE

CROSS-REFERENCE TO RELATED APPLICATIONS

This application claims the benefit of the filing date of U.S. provisional application No. 60/992,467, filed on Dec. 5, 2007 as the teachings of which are incorporated herein by reference.

BACKGROUND OF THE INVENTION

1. Field of the Invention

The present invention relates to communication systems, and, in particular, to calibration of related clocks employed for separate modes of operation in a communication system.

2. Description of the Related Art

Many types of communication systems, especially communication systems employed for information transfer with wireless (including cellular) devices, employ two or more modes of operation depending on the relative processing activity of a given device. One example of switching between multiple modes of operation is the switching between an active mode and an inactive mode, such as the commonly termed "sleep" mode, in a wireless or cellular communication system. During sleep mode, portions of a device's circuitry are disabled, such as by disabling the power or clock signals to the device's processing hardware. Switching a device to sleep mode when the device is not required to send or receive information allows the device to, for example, conserve power or generate less interference noise for other devices in the system.

In wireless communication systems, a handset or other type of mobile device (collectively termed herein as "user equipment" or "UE") generally switches to a slow clock during sleep mode that is used to track system time and periodically "wake up" the device. During a wake-up period (or wake-up mode), the UE transitions to active mode and typically carries out activities such as re-synchronizing to serving-cell timing, checking for incoming calls, and adjusting power control. Once these activities are completed and the UE is not required to communicate with the network, the UE returns to sleep mode.

For a UE to perform tasks during wake-up mode, the UE receives data from its associated network. In Wireless Code Division Multiple Access (WCDMA) communication systems (such as those operating in accordance with a version of the UMTS WCDMA or IMT-2000 standard), data is transmitted between a network cell (e.g., base station) and a UE as encoded sequences, which are received by synchronizing the UE receiver to the exact sequence timing, which is the frequency and code phase of the sequence employed to encode the basic data. Timing of sequences within a cell is termed "cell timing" and is determined with relatively high resolution. During wake-up mode and fully active mode for network communication, a fast clock (relative to the slow clock of sleep mode) is employed by the UE, which, for WCDMA systems, is termed a global counter (GC) upon which the cell timing is defined. Due to characteristics of mobile communications, the cell timing of the received data may fluctuate in time, and, consequently, the UE receiver dynamically adjusts its GC (fast clock) in response to fluctuations of the cell timing.

When the UE transitions to wake-up mode, the GC is set to proper timing according to the actual time elapsed over the last sleep interval. To set the timing of the GC, a calibration procedure is performed in which the time interval related to the slow clock is converted to a corresponding time interval related to the fast clock. Without errors introduced by the system, and a known ratio R between the frequencies of the fast and slow clocks, the conversion from the slow clock time interval to the fast clock time interval is computed by multiplying the slower clock interval by R.

However, in practice, the ratio R fluctuates over time due to temperature gradients and electrical noise. Temperature changes tend to introduce drift in clock frequency, while additive electrical noise tends to introduce duty-cycle fluctuation in the clock signal. Consequently, in practice, the ratio R should be dynamically measured and then used to set the fast clock frequency/phase for the GC when the UE transitions to wake-up mode. This procedure, termed clock calibration, starts when the UE transitions to wake-up mode and includes a clock ratio measurement process and a fast clock setup process. During the clock ratio measurement process, the ratio R is determined by i) defining an interval of N counts of the slow clock (also called a calibration time interval or measurement time interval), ii) measuring the corresponding number M of counts of the fast clock during the calibration interval, and iii) setting the ratio R as M/N. During the fast clock setup process, the number L of counts of the slow clock during the previous sleep interval is measured, and the number T of counts of the fast clock that would have registered had the fast clock been kept on during that previous sleep interval is calculated as T=(M*L)/N, where (L/N) is defined as the ratio between the sleep time interval and the calibration time interval.

Due to added noise and temperature variations, errors may arise in measuring the number M of counts of the fast clock during the calibration interval. When M is multiplied by L/N, which may be relatively large, the errors of M may be magnified resulting in relatively large errors in fast clock count T. These relatively large errors in T can cause the UE to lose synchronization with the cell. As an example, suppose that a system UE operating in accordance with a WCDMA standard employs a slow clock of 32,768 Hz and a fast clock of 61.44 MHz, resulting in a ratio R of 1875. Given a measurement time interval N of 64 msec and a sleep time interval L of 1.024 sec, the ratio L/N is 16. Lab measurements using real UE hardware have found that the error in M may be as large as ±25 counts. When calculating T, this error is magnified by 16 times (i.e., L/N) such that the resulting error in T is ±400 counts. For a WCDMA system, where the fast clock rate is 16 times the base chip rate of the WCDMA system (e.g., 3.84 MHz), magnification of an error in the slow clock can result in an offset of 25 chips, causing severe degradation of the WCDMA system's synchronization performance.

SUMMARY OF THE INVENTION

In one embodiment, the present invention is a method for calibrating a second clock based on a first clock. The method measures (i) a number L of counts of the first clock during a first interval and (ii) a number M(n) of counts of the second clock during a second interval, wherein the second interval corresponds in length to N counts of the first clock. A filter is then applied to the number M(n) of counts of the second clock to generate a filtered count F(n), and the second clock is updated based on L, N, and F(n). In another embodiment, the present invention is an apparatus for practicing the method.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
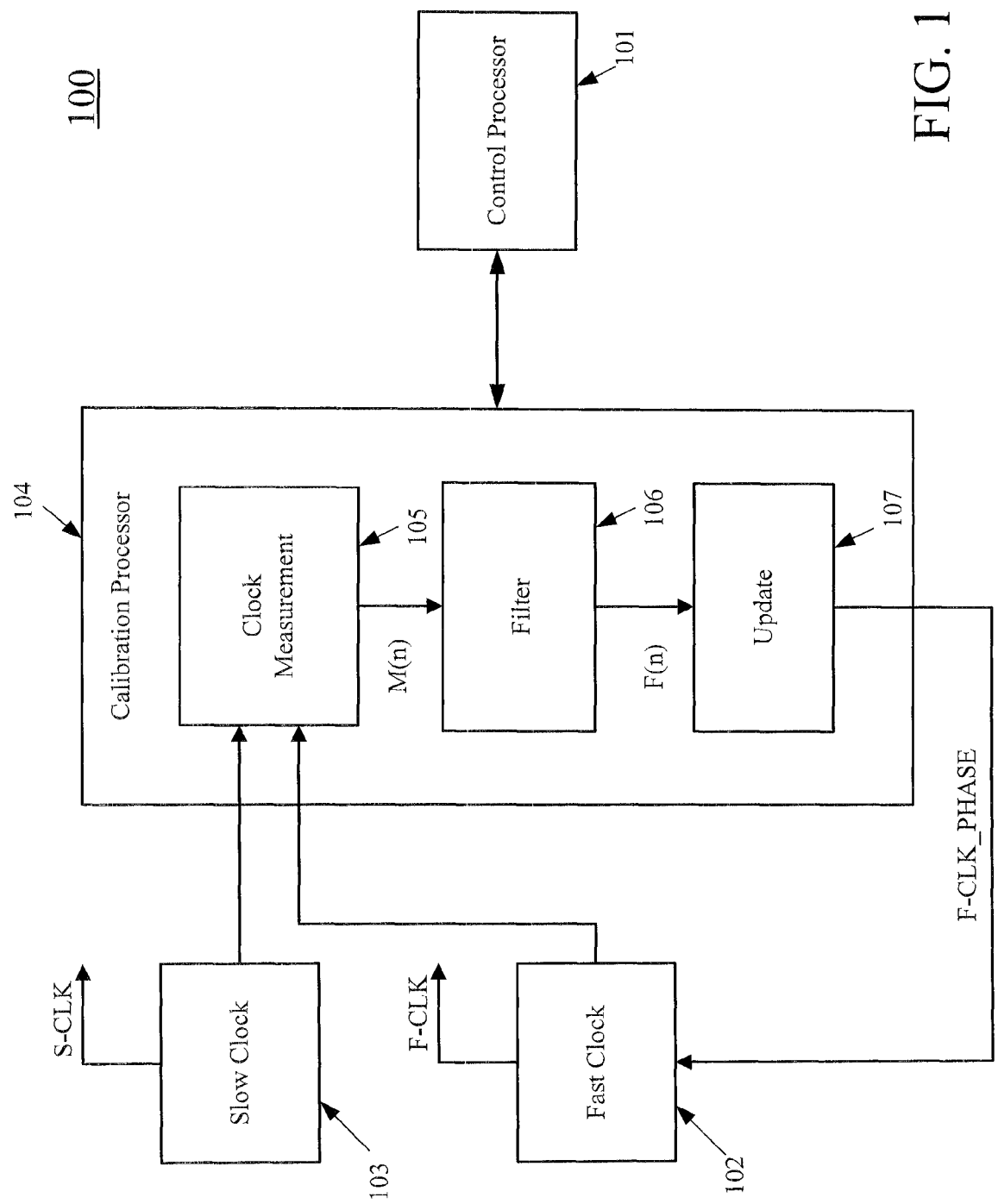
FIG. 1 shows a block diagram of a first exemplary embodiment of the present invention.

FIG. 1 shows a block diagram of a first exemplary embodiment of the present invention. System 100 comprises control processor 101, fast clock 102 generating a fast clock signal F-CLK, slow clock 103 generating slow clock signal S-CLK, and calibration processor 104. Calibration processor 104 includes clock measurement block 105, filter 106, and update generator 107. The functional blocks of FIG. 1 are exemplary and a given implementation might include some or all of these functional blocks in an integrated circuit (IC) as either software or hardware. Consequently, the functional blocks of FIG. 1 are employed to facilitate explanation of the present invention without limiting the present invention to the structure shown in the figures.

The first exemplary embodiment of FIG. 1 might be advantageously employed for a wireless communication system operating in accordance with a Wideband Code Division Multiple-Access (WCDMA) communication system, where the exemplary embodiment of FIG. 1 is employed by mobile user equipment (UE) for calibration of a global counter (GC) between slow and fast clock signal sources when the UE transitions from inactive (e.g., sleep) mode to active mode.

Control processor 101 might represent the main processor of the UE that indicates when the UE transitions between inactive and active states, causing calibration processor 104 to calibrate the fast clock (GC) phase. Fast clock 102 and slow clock 103 might be implemented as counters clocked at corresponding clock rates. Consequently, signals F-CLK and S-CLK represent sequences of counter values each having a given phase (counter sequence value) at a given moment of time.

For purposes of the description herein of the exemplary embodiments, the following definitions are employed to facilitate understanding of the present invention. The value L is equivalent to the number of counts of the slow clock during a predefined first interval of time, where the first interval might correspond to a measured number of counts during a sleep interval that precedes a wake-up period, in a WCDMA system. The value R represents the ratio of the frequency of the fast clock to the frequency of the slow clock. The ratio R is generally equivalent to M/N, where i) the value N is the number of counts of the slow clock in a predefined second interval of time, where the predefined second interval might correspond to a calibration time period in a WCDMA system, and ii) the value M is the number of counts of the fast clock in the second interval. The value T, which may be calculated as T=(M*L)/N, corresponds to a number of counts of the fast clock that would have occurred during the first interval had the fast clock not been stopped. The calculated value of T is then employed to update the GC (fast clock).

Referring to FIG. 1, clock measurement block 105 measures the number L of counts of slow clock 103 during the predefined first interval (e.g., previous sleep interval). Clock measurement block 105 also measures the number N of counts of slow clock 103 and the number M of counts of fast clock 102 during the predefined second interval after control processor 101 indicates a transition to active mode.

Although generating the value of M might be performed on each transition for wake-up mode, in some embodiments, the fast clock might be updated with the estimated value of M occasionally. For some systems operating in accordance with a WCDMA standard, the value of M is estimated for each wake-up transition when a cell search is performed, or after a predefined lower-bound/threshold amount of elapsed time. Consequently, the value of M is estimated for every K wake-up transitions, where K is a system-dependent parameter related to how often a cell search is performed by a UE. The value of M might be written as a function of time, where M(n) is the measured value of M at the n-th measurement time step (n being a discrete counting value in a sequence corresponding to a moment of time).

In accordance with exemplary embodiments of the present invention, filter 106 applies a filter function to M(n), where the filter function is given as in equation (1):

$$F(n)=aF(n-1)+(1-a)M(n); \qquad (1)$$

In equation (1), a is a filter weight parameter having value from $0<a<1$; F(n) is the filter output value corresponding to the filtered value of M(n); and a specified initial state of the filter is F(−1). The filter function of equation (1) approximates an IIR (infinite impulse response) filter. The recursion of equation (1) generates the filter output F(n) by exponentially weighting the value of M(n), where the weight of M(n) is 1 and the weight of M(n−t) is $a^t$, thus giving greater weight to more-recent data measurements. Determination for values of a and the initial state F(−1) is now described.

The parameter a is system-specific parameter and might be tuned for a given implementation based on the following guidelines. Higher values of a within the range 0 to 1 yield a lower variance for the sequence F(n), thereby providing smaller error in the filtered clock measurement. However, higher values of a generate a greater delay in updating the current value of F(n) with a more highly-weighted (more-recent) component value of M(n), giving slower response to relatively rapid transients in the clock value. However, lower values of a, while improving dynamic tracking speed, generate greater error from higher variance in values of F(n).

One skilled in the art might employ simulations, network measurements, or a combination of these techniques to determine a relatively optimal value of a for a given embodiment. As an example, a system UE that employs a slow clock of 32768 Hz and a fast clock of 61.44 MHz, has a ratio R of 1875. Given a measurement time interval of 64 msec and a sleep time interval of 1.024 sec, the ratio L/N is 16. For a system employing the filter of equation (1), a might typically range from 0.65 to 0.95, which yields errors of ±2 to ±6 counts in the value of M, instead of ±25 counts when a filter is not employed.

Additional design considerations to select parameter a might include the sampling rate at which clock measurements are performed since performance of the filter function of the form of equation (1) depends on the sampling rate of the measurement values M(n). For example, if the sampling rate at an instant of time is increased by a factor k, the sample M(n−t) at the lower sampling rate corresponds to the sample M(n−kt) at the higher sampling rate. The weight $a^t$ at the lower sampling weight then corresponds to the weight $(a^{1/k})^{kt}$ at the higher sampling rate (i.e., if the filter coefficient at the lower sampling rate is a, the filter coefficient for the higher sampling rate is adjusted to $a^{1/k}$). For example, if a=0.95 is used for a sampling rate of 4 seconds (i.e., a clock measurement is carried out once every four seconds), and if the sampling rate is reduced such that a clock measurement is performed once very 12 seconds, then the filter parameter may be adjusted to $a=0.95^4=0.81$. Such adjustments in a might be performed dynamically by the system.

Further design considerations to select parameter a might account for physical conditions such as temperature variation. For example, if amplifiers are enabled or disabled, or if the UE is in an idle state for long periods of time, considerable changes in device temperature might occur. For such cases, if local temperature measurements are available, the parameter a might be changed in relation to the measured local temperature for improved performance.

The initial state F(−1) for the filter of equation (1) might be set either through use of a training period or by occasional extended measurement periods. During a training period, such as during the registration period of a UE to the network, a UE is in an awake state and extended clock measurements might be made and averaged to generate F(−1). Similarly, immediately before or at an initial wake-up period, the UE might perform an extended calibration. In this case, an extended second interval of N' counts, N'=rN, is employed, where r is the extension factor. The resulting value for fast counts M' is (rM+E), where i) the value M is the measured value that would have been obtained for the second interval N and ii) the value E is the error in the fast clock due to fluctuations in the duty cycle of the slow clock. Then, given these definitions, the initial state F(−1) is M'/r=M+(E/r), which implies that the error of the initial state using the extended calibration interval is reduced by a factor of r.

Returning to FIG. 1, update generator 107 receives the value F(n), which represents the filtered value of M(n), and employs this value to generate the updated fast clock phase to reduce, e.g., the potential offset in the GC when switching system timing to F-CLK in active mode. Update generator 107, therefore, generates an updated value for T as F(n)*(L/N).

Another embodiment of the present invention simplifies implementation of the filter that applies equation (1) to M(n). The form of filter equation (1) is modified by defining x(n) as M(n)−F(−1), and defining y(n) as given in equation (2);

$$y(n)=ay(n-1)+(1-a)x(n); \qquad (2)$$

where a is as defined for equation (1), the initial state y(−1) is 0, and the desired filter output is given in equation (3):

$$F(n)=y(n)+F(-1). \qquad (3)$$

Figure 2:
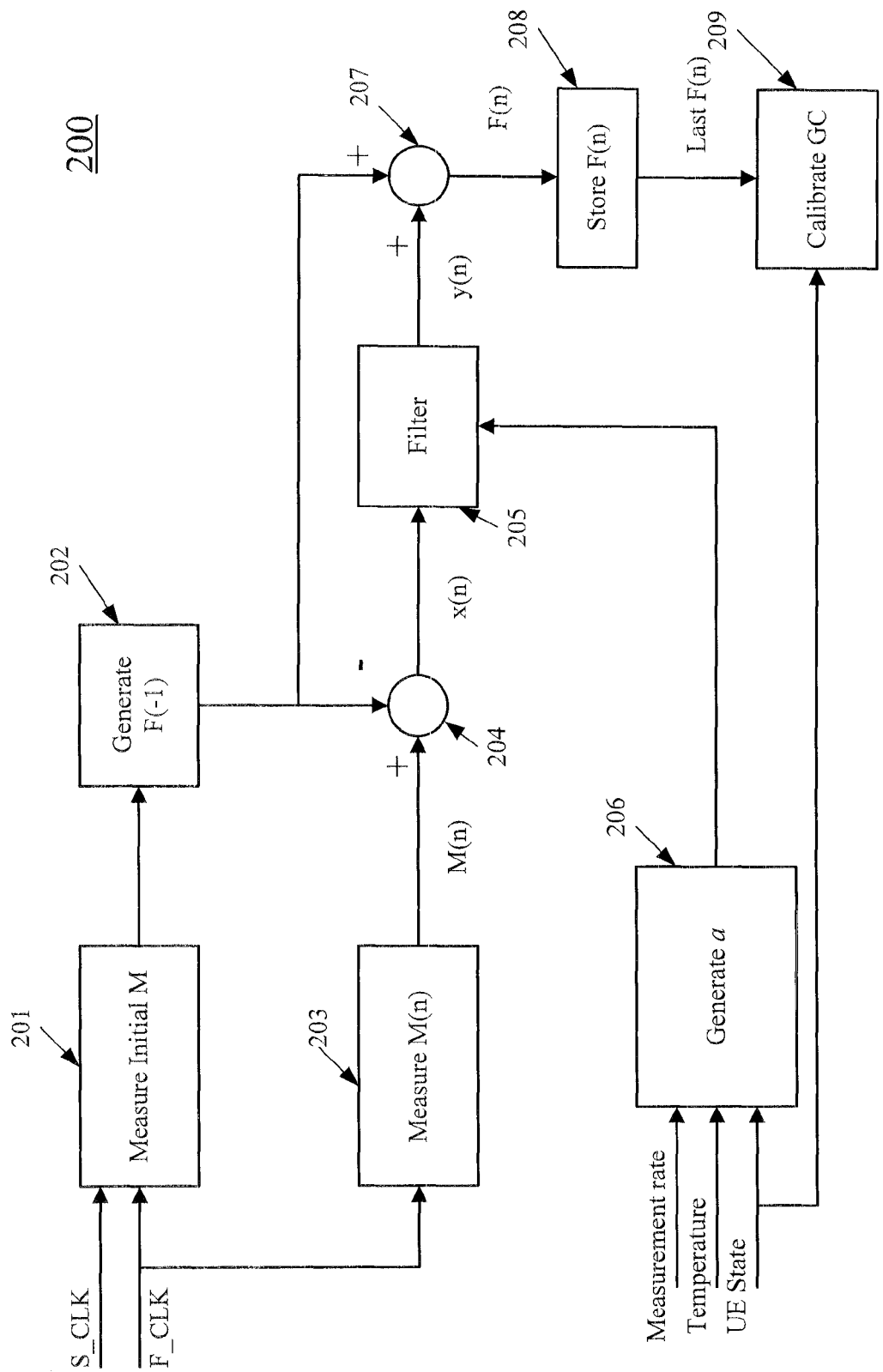
FIG. 2 shows a block diagram of a second exemplary embodiment of the present invention employing a modified filter function.

FIG. 2 shows a block diagram of a second exemplary embodiment of the present invention employing the modified filter function of equations (2) and (3). An initial measurement for M is obtained as described above at block 201 and a corresponding initial value for F(−1) generated at block 202. Through operation of the system, M(n) is periodically measured at block 203 either at predefined intervals (e.g., K wake-up events) or after a minimum threshold of time passes. The value x(n)=M(n)−F(−1) is generated by combiner 204, and the value a is generated by block 206 based upon at least one of i) the measurement rate for M(n), ii) the temperature of the system, and iii) the current UE state (active or inactive). Filter block 205 applies equation (2) described above based on x(n) and a. Combiner 207 generates F(n) as y(n)+F(−1), which is stored at block 208. When necessary, at block 209, the GC is calibrated using the last stored value for F(n). Blocks/combiners 201 though 209 represent functions that may be implemented as either steps in a software program, dedicated logic circuits, or by a combination of both software and logic circuits.

As would be apparent to one skilled in the art, use of definitions herein is exemplary and may be adapted to use with other particular embodiments. Unless explicitly stated otherwise, each numerical value and range should be interpreted as being approximate as if the word "about" or "approximately" preceded the value of the value or range. In addition, while the values for quantities such as R, M, N, and L might be integer-valued for the description and examples, the present invention is not so limited to purely integer values.

In addition to the techniques described herein, to decrease a noise level in the value of T for an exemplary system, the noise component of M and/or the ratio L/N might be decreased. Typical techniques for reducing the noise component of M might include a designer's careful hardware implementation to reduce duty-cycle fluctuations of the clock by reducing temperature sensitivity of the corresponding circuitry. Decreasing the ratio L/N might include either shortening the first interval or increasing the second interval. Factors that might determine a given design choice for the first interval typically center on a particular application for the fast and slow clock circuitry, while factors that might determine a design choice for the second interval typically center on system synchronization performance and power conservation.

The exemplary embodiments of the present invention are described herein with reference to a method that might be advantageously implemented in software by a processor. However, one skilled in the art might also implement an embodiment of the present invention in hardware, or a combination of hardware and software, based on particular design needs. Consequently, the present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of elements might be implemented as processing blocks in a software program. Such software may be employed in, for example, a digital signal processor, microcontroller, or general-purpose computer.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bit stream or other sequence of signal values electrically or optically transmitted through a medium, stored magnetic-field variations in a magnetic recording medium, etc., generated using a method and/or an apparatus of the present invention.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

We claim:

1. A method for calibrating a second clock based on a first clock, the method comprising:
   (a) measuring a number L of counts, L>0, of the first clock during a first interval, wherein the second clock is stopped during the first interval;
   (b) measuring a number M(n) of counts, M(n)>0, of the second clock during a second interval, wherein the second interval corresponds in length to N counts, N>0, of the first clock;
   (c) applying filtering to the number M(n) of counts of the second clock to generate a filtered count F(n), F(n)>0; and
   (d) updating the second clock based on L, N, and F(n), wherein the updating of the second clock corresponds to a number T of counts, T>0, that would have registered had the second clock not been stopped.

2. The method of claim 1, wherein:
   the first interval is a predefined period corresponding to a sleep mode of a wireless device; and
   the second interval is a predefined period of time corresponding to a transition from the sleep mode to an awake mode of the wireless device.

3. The method of claim 2, wherein step (b) is repeated for each transition from the sleep mode to the awake mode.

4. The method of claim 2, wherein step (b) is repeated after determining that a specified number of transitions from the sleep mode to the awake mode have occurred, wherein the specified number is greater than one.

5. The method of claim 1, wherein the first clock is a slow clock and the second clock is a fast clock.

6. The method of claim 1, wherein updating of the second clock is proportional to $F(n)*L/N$.

7. The method of claim 1, wherein, the filtered count F(n) is proportional to:
   $aF(n-1)+(1-a)M(n)$, wherein:
   a is a filter weight parameter having a value between 0 and 1; and
   F(n-1) is a filtered count of the second clock for a previous iteration n.

8. The method of claim 7, wherein the filter weight parameter a is selected based on at least one of measurement rate, temperature, and device state.

9. The method of claim 1, wherein, in step (c), the filtered count F(n) is proportional to:
   $y(n)+F(-1)$, where $$y(n)=ay(n-1)+(1-a)x(n);$$

$$x(n)=M(n)-F(-1);$$

a is a filter weight parameter having a value between 0 and 1; and
   F(-1) is an initial filter state.

10. The method of claim 1, wherein:
    the first interval is a predefined period corresponding to a sleep mode of a wireless device;
    the second interval is a predefined period of time corresponding to a transition from the sleep mode to an awake mode of the wireless device;
    the first clock is a slow clock and the second clock is a fast clock;
    T is proportional to $F(n)*L/N$; and
    the filtered count F(n) is proportional to:
    $aF(n-1)+(1-a)M(n)$, wherein:
    a is a filter weight parameter having a value between 0 and 1; and
    F(n-1) is a filtered count of the second clock for a previous iteration n.

11. An apparatus for calibrating a second clock based on a first clock, the apparatus comprising:
    a measurement generator adapted to:
    (i) measure a number L of counts, L>0, of the first clock during a first interval, wherein the second clock is stopped during the first interval;
    (ii) measure a number M(n) of counts, M(n)>0, of the second clock during a second interval, wherein the second interval corresponds in length to N counts, N>0, of the first clock;
    a filter adapted to apply filtering to the number M(n) of counts of the second clock to generate a filtered count F(n), F(n)>0; and
    an update generator adapted to update the second clock based on L, N, and F(n), wherein the updating of the second clock corresponds to a number T of counts, T>0, that would have registered had the second clock not been stopped.

12. The apparatus of claim 11, wherein:
    the first interval is a predefined period of time corresponding to a sleep mode of a wireless device; and
    the second interval is a predefined period of time corresponding to a transition from the sleep mode to an awake mode of the wireless device.

13. The apparatus of claim 11, wherein the first clock is a slow clock and the second clock is a fast clock.

14. The apparatus of claim 11, wherein updating of the second clock is proportional to $F(n)*L/N$.

15. The apparatus of claim 11, wherein the filtered count F(n) is proportional to:
aF(n−1)+(1−a)M(n), wherein:
a is a filter weight parameter having a value between 0 and 1; and
F(n−1) is a filtered count of the second clock for a previous iteration n.

16. The apparatus of claim 11, wherein the filtered count F(n) is proportional to:
y(n)+F(−1), where $$y(n)=ay(n-1)+(1-a)x(n);$$

$$x(n)=M(n)-F(-1);$$

a is a filter weight parameter having a value between 0 and 1; and
F(−1) is an initial filter state.

17. The apparatus of claim 11, wherein the apparatus is an integrated circuit.

18. The apparatus of claim 11, wherein:
the first interval is a predefined period corresponding to a sleep mode of a wireless device;
the second interval is a predefined period of time corresponding to a transition from the sleep mode to an awake mode of the wireless device;
the first clock is a slow clock and the second clock is a fast clock;
T is proportional to F(n)*L/N; and
the filtered count F(n) is proportional to:
aF(n−1)+(1−a)M(n), wherein:
a is a filter weight parameter having a value between 0 and 1; and
F(n−1) is a filtered count of the second clock for a previous iteration n.

* * * * *